United States Patent
Rotondaro et al.

[11] Patent Number: 6,153,018
[45] Date of Patent: Nov. 28, 2000

[54] METAL RINSING PROCESS WITH CONTROLLED METAL MICROCORROSION REDUCTION

[75] Inventors: Antonio L. P. Rotondaro, Dallas, Tex.; Rita Vos, Alken; Mark Heyns, Linden, both of Belgium

[73] Assignee: Interuniversitair Microelektronica Centrum, Leuven, Belgium

[21] Appl. No.: 08/987,261

[22] Filed: Dec. 9, 1997

[30] Foreign Application Priority Data

Dec. 9, 1996 [EP] European Pat. Off. .............. 96870157

[51] Int. Cl.$^7$ ................ B08B 3/08; C23G 1/02; G03C 5/00

[52] U.S. Cl. ................ 134/27; 134/28; 134/41; 430/329; 430/331

[58] Field of Search ................ 134/23, 28, 41, 134/27; 216/83; 430/329, 331

[56] References Cited

U.S. PATENT DOCUMENTS

| | | | |
|---|---|---|---|
| 3,085,917 | 4/1963 | Netzler | 134/27 |
| 3,649,260 | 3/1972 | Denniston et al. | 419/26 |
| 3,787,239 | 1/1974 | Schroeder et al. | 134/2 |
| 3,813,309 | 5/1974 | wappingers et al. | 216/83 |
| 4,778,532 | 10/1988 | McConell et al. | 134/10 |
| 5,102,777 | 4/1992 | Lin et al. | 430/331 |
| 5,201,960 | 4/1993 | Starov | 134/11 |
| 5,759,751 | 6/1998 | Shimizu et al. | 430/329 |

FOREIGN PATENT DOCUMENTS

| | | |
|---|---|---|
| 0596515 | 5/1994 | European Pat. Off. . |
| 0678788 | 10/1995 | European Pat. Off. . |

OTHER PUBLICATIONS

Journal of the Electrochemical Society, vol. 127, No. 2, Feb. 1980, pp. 386–395, XP002025557, Kaplan L H; Bergin B K: "Residues from wet processing of positive resists" * p. 390 — p. 395.

European Search Report dated Feb. 18, 1997.

*Primary Examiner*—Randy Gulakowski
*Assistant Examiner*—Saeed Chaudhry
*Attorney, Agent, or Firm*—Knobbe, Martens, Olson, And Bear LLP

[57] ABSTRACT

Process for rinsing a metallized substrate subject to metal microcorrosion using an acidic aqueous rinsing solution wherein the rinsing solution comprises at least one strong inorganic acid in an amount enough to reduce the alkalinity of the rinse solution to a level low enough to reduce microcorrosion of the said metal layer while rinsing.

32 Claims, 7 Drawing Sheets

Table I

| Treatment | Degree of corrosion | |
|---|---|---|
| | Bare Al | Stacked Al |
| 30' wet strip + 2' IPA + 10' DI-rinse (= reference) | not visible | not visible |
| 45' dry strip | not visible, residues present | not visible, residues present |
| 45' dry strip + 50' stagnant DI | little visible | little visible |
| 60' wet strip + 50' stagnant DI | heavy | heavy |
| 60' wet strip + 50' 1:1000 HNO$_3$ | very minor | very minor |
| 60' wet strip + 50' 1:100 HNO$_3$ | very minor | very minor |
| 45' dry strip + 50' 1:100 HNO$_3$ | very minor | very minor |
| 60' wet strip + 50' 1:1000 HF | very heavy | very heavy |
| 60' wet strip + 50' 1:100 HF | very heavy | very heavy |
| 45' dry strip + 50' 1:100 HF | very heavy | very heavy |
| 60' wet strip + 50' 1:1000 HCl | little | little |
| 45' dry strip + 50' 1:100 HCl | little | little |

Table I

| Treatment | Degree of corrosion | |
|---|---|---|
| | Bare Al | Stacked Al |
| 30' wet strip + 2' IPA + 10' DI-rinse (= reference) | not visible | not visible |
| 45' dry strip | not visible, residues present | not visible, residues present |
| 45' dry strip + 50' stagnant DI | little visible | little visible |
| 60' wet strip + 50' stagnant DI | heavy | heavy |
| 60' wet strip + 50' 1:1000 HNO3 | very minor | very minor |
| 60' wet strip + 50' 1:100 HNO3 | very minor | very minor |
| 45' dry strip + 50' 1:100 HNO3 | very minor | very minor |
| 60' wet strip + 50' 1:1000 HF | very heavy | very heavy |
| 60' wet strip + 50' 1:100 HF | very heavy | very heavy |
| 45' dry strip + 50' 1:100 HF | very heavy | very heavy |
| 60' wet strip + 50' 1:1000 HCl | little | little |
| 45' dry strip + 50' 1:100 HCl | little | little |

*Figure 1*

Table II

| Treatment | Resistance (kΩ) | |
| --- | --- | --- |
| | Bare Al | Stacked Al |
| 30' wet strip + 2' IPA + 10' DI-rinse (= reference) | 287 ± 11 | 276 ± 10 |
| 45' dry strip | 289 ± 19 | 260 ± 11 |
| 45' dry strip + 50' stagnant DI | 308 ± 117 | 331 ± 49 |
| 60' wet strip + 50' stagnant DI | > $10^6$ | 345 ± 67 |
| 60' wet strip + 50' 1:1000 $HNO_3$ | 289 ± 19 | 270 ± 19 |
| 60' wet strip + 50' 1:100 $HNO_3$ | 281 ± 38 | 269 ± 12 |
| 45' dry strip + 50' 1:100 $HNO_3$ | 274 ± 11 | 267 ± 6 |
| 60' wet strip + 50' 1:1000 HF | > $10^6$ | > $10^5$ |
| 60' wet strip + 50' 1:100 HF | > $10^6$ | > $10^6$ |
| 45' dry strip + 50' 1:100 HF | > $10^6$ | > $10^6$ |
| 60' wet strip + 50' 1:1000 HCl | 199 ± 125 | 90 ± 66 |
| 45' dry strip + 50' 1:100 HCl | 235 ± 90 | 73 ± 103 |

Figure 2

METAL RINSING PROCESS WITH CONTROLLED METAL MICROCORROSION REDUCTION

FIELD OF THE INVENTION

This invention relates to a rinsing process for metallized substrates, particularly it relates to a rinsing process for rinsing metallized substrates subjected to photoresist stripping using organic strippers comprising an alkanolamine. Moreover, the invention relates to a new use of nitric acid in rinsing solutions and organic photoresist strippers, as well as to new rinsing solutions and strippers.

BACKGROUND OF THE INVENTION

Organic photoresist strippers are commonly used both for the removal of photoresist from metallized wafers as for the cleaning of the metal layers during the device manufacturing cycle. The most important requirement for such strippers therefore is a negligible metal microcorrosion property. Modern organic strippers, however, are composed of an alkanolamine and a polar organic solvent. When such strippers are rinsed from the wafer surface during processing, the amine group reacts with the water and hydroxide ions are generated.

High alkalinity has a detrimental effect on the exposed metal layers, especially on aluminium and its alloys. Therefore, it is very important that the high alkalinity of the rinsing solution as occurring after solvent stripping is decreased as fast as possible.

To solve this problem, it is common practice to dip the wafers in isopropylalcohol (IPA) or other organic solvents to remove the amine groups of the organic strippers before water contact. Alternatively, organic acidic compounds are added to the photoresist stripper solution as corrosion inhibitors (G. Schwartzkopf, et al (1993) *Proceedings of the Symposium on Interconnects, Contact Metallization and Multi-level Metallization and Reliability for Semiconductor Devices, Interconnects and Thin Insulator Materials*. ECS Proc. 93–25, p. 379, Electrochemical Society, Pennington, N.J.).

For obvious environmental reasons, e.g. waste disposal problems, there is a wish to decrease the total consumption of organic chemicals. Moreover, by avoiding an organic solvent dip after stripping, there is no need for an intermediate bath and obvious cost savings on room space can be generated. Therefore, the use of inorganic acids to reduce the alkalinity of the post-stripping rinse solution has been proposed. U.S. Pat. No. 5,336,371 and U.S. Pat. No. 5,175,124 describe the use of carbonic acid, a weak inorganic acid, to acidify the rinsing water. This is achieved by bubbling $CO_2$ through the water-based rinsing solution. In this process monitoring the concentration of the carbonic acid is difficult. In particular, the pH of the carbonated rinse solution will depend upon the total amount of $CO_2$ that will dissolve in the water. This is influenced by temperature, exposure time to air etc., and therefore difficult to control.

EP 596 515 discloses how metal corrosion is avoided by adding weak acids to alkaline containing strippers. Thereby the nucleophilic amine is partially neutralized by the formation of a reversible salt-like complex. However, during the subsequent rinsing, free amine groups originating both from the non-neutralized fraction and possibly from the dissociated complex fraction, will react with water and thus lead to the formation of hydroxyl ions. Thus, the use of such weak acids makes an accurate pH control difficult resulting in improper neutralization of the rinse solution which can be detrimental to the metal layer.

OBJECT OF THE INVENTION

It is therefore an object of this invention to provide a rinsing process for metallized substrates which are subject to metal microcorrosion allowing a controllable neutralization of the rinsing solution.

This objective is attained by adding strong inorganic acids such as $HNO_3$ to the rinsing solution. Moreover, it was found that by using strong inorganic acids a much broader pH-range (from pH 0 to 7) can be reached either by adding controlled amounts of the acid to the rinsing solution during the rinsing step, or in another embodiment by adding it to the stripper.

BRIEF SUMMARY OF THE INVENTION

In accordance with the present invention, a process for rinsing a metallized substrate which is subject to metal microcorrosion uses an acidic aqueous rinsing solution comprising at least one strong inorganic acid in an amount enough to reduce the alkalinity of the rinse solution to a level low enough to reduce microcorrosion of the metal layer while rinsing. The rinsing process can be used at any stage of the metallized substrate production process where microcorrosion is possible to occur. The substrate can be covered completely with a metal or only a part of the substrate surface can be covered with a metal layer.

Especially metallized wafers used in semiconductor device, and which are subject to microcorrosion due to photoresist stripping with alkanolamine comprising strippers can be rinsed by the process according to the present invention.

Although inexpensive, inorganic de-ionised (DI) water rinses are particularly vulnerable to causing metal corrosion. It was found that diluted strong acid water-based rinsing solutions, and preferably DI water-based rinsing solutions, particularly allow for acidification to be more controlled and aluminium alloy microcorrosion to be optimally governed. The strong inorganic acid which gives good results is nitric acid when used with a post-photoresist stripper rinse solution or in another embodiment when added to an alkanolamine comprising photoresist stripper. Other strong inorganic acids exerting the same effect can equally be added to the rinsing solution.

DESCRIPTION OF THE DRAWINGS

FIG. 1 represents the results of the SEM inspection for corrosion after treatment of bare and stacked aluminium lines in different acidic mixtures. (Table 1)

FIG. 2 represents the results of the resistance measured for bare and stacked aluminium meander structures (length= 4.63 m) after treatment with different acidic mixtures. (Table II)

FIG. 5 (right) are bare Al-lines after wet-stripping followed by a 50 min. stay in DI-water.

DETAILED DESCRIPTION OF THE INVENTION

Figure 3A:
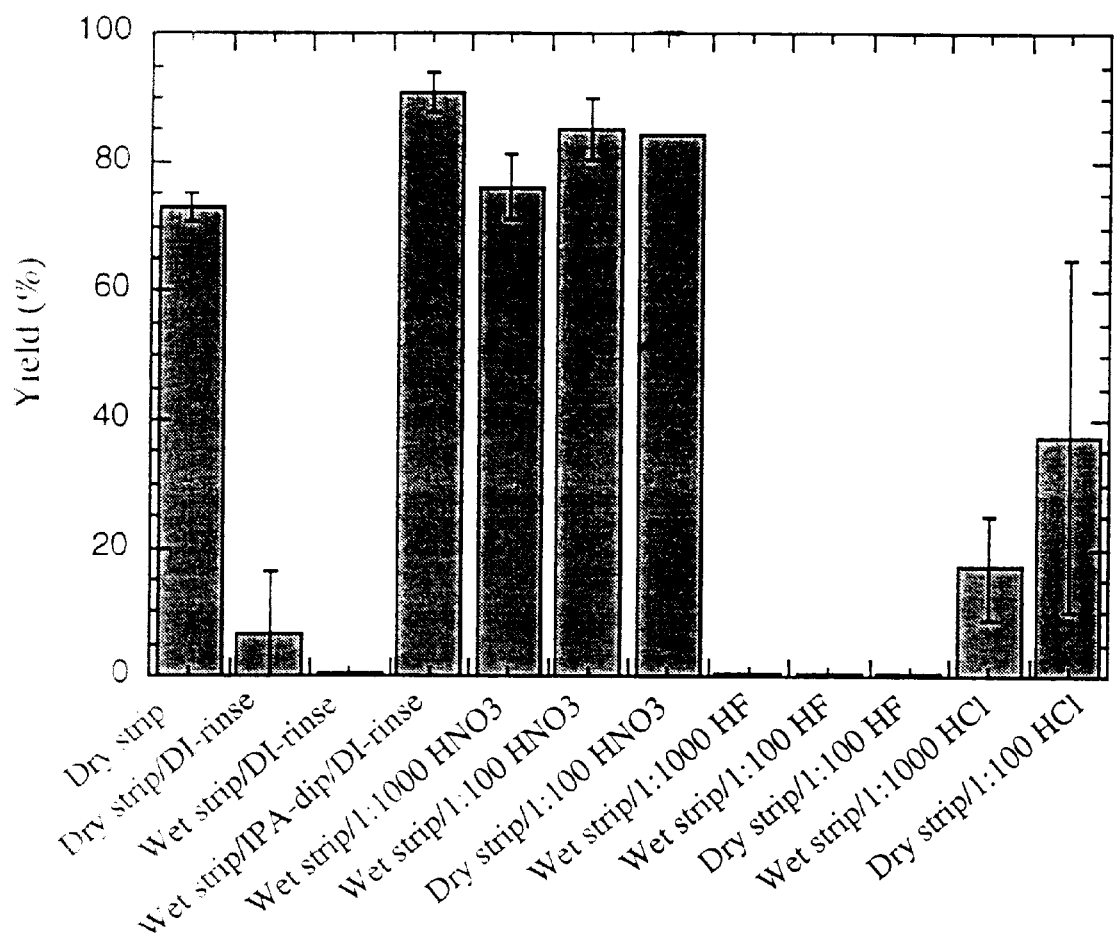
FIG. 3a gives the electrical yield calculated for bare Al-meander structures.

By strong inorganic acids, it is meant in this patent application those strong inorganic acids which can be added to the rinsing solution without significantly corroding the metallized substrate as they only negligibly attack the passivating oxide film which is always present on metals such as aluminium or aluminium alloys, hereby inhibiting the corrosion of the underlying metal. Such strong inorganic acids can be selected from the group consisting of $HNO_3$, $H_2SO_4$, HI, $H_3PO_4$, $H_3CrO_4$ or a mixture thereof. Preferably, the strong inorganic acid is $HNO_3$.

The amounts of strong inorganic acid used in the rinsing solutions of this invention are obviously dependent upon the number of metallized substrates and the kind of stripper used. For $HNO_3$, good results are obtained with a 1:80 to 1:1200 diluted nitric acid solution, preferably it is a 1:100 to 1:1000 dilution and most preferably a 1:100 dilution.

The metal layer on the metallized substrates which can be rinsed according to the present invention are for example, Al alloys. AlSiCu alloys and especially Al/1% Si/0.5% Cu alloys are particularly suited for rinsing according to the invention. Especially, the microcorrosion of aluminium alloys is preferably decreased during rinsing by using diluted nitric acid in a 1:100 to 1:1000 dilution.

The rinsing solutions of the present invention are effective in rinsing metallized wafers subjected to a wide range of organic photoresist strippers comprising an alkanolamine. Advantageously, a substrate subjected to MS-2001 (OLIN HUNT), a known solvent strippers can be rinsed with the rinsing solutions according to the invention.

In another embodiment of the invention, the rinsing solutions can also be used for rinsing metallized wafers at stages in the processing cycle other than after solvent stripping. As such one can rinse metallized wafers from which the photoresist has been removed by dry stripping.

Dry stripping (commonly referred to as oxygen ashing) is done using oxygen plasmas in plasma etching tools. Plasmas containing oxygen produce species that attack the photoresist to form $CO_2$, $H_2O$, $N_2O$ and $SO_2$ as end products. Such oxygen plasmas provide a highly selective method for removing organic material like photoresist, since $O_2$ plasmas do not etch Si, $SiO_2$ and Al or Al-alloys. An overview of various designs of plasma ashing equipment is discussed by Skidmore (Semiconductor International, August 1988, p. 54). When dry stripped metallized substrates need to be rinsed or to be put in contact with water, the rinsing solutions of the present invention are found to have little or no corrosive effect on the substrates, especially not on dry stripped photoresists with aluminium alloy layer.

EXAMPLES

The corrosion of aluminium alloys is evaluated in a quartz tank without circulation or filtration, both on silicon wafers, CZ-growth <100>, n-type, 1–30 Ohmcm, 150 mm diameter wafers with bare aluminium meanders (700 nm Al/1%SI/ 0.5%Cu) and with stacked meanders structures (Ti, TiN, Al/1%SI/0.5%Cu, Ti and TiN with a thickness of respectively 30, 80, 700, 20 and 80 nm). After the photostep and the etching (LAM_TCP 9600), the wafers are stripped in MS-2001 (OLIN HUNT) for 60 min at 90/C, followed by a 50 min stay in a stagnant tank to which diluted inorganic nitric acid ($HNO_3$) solutions in two different mixing ratios (1:100 and 1:1000) are added. Finally, the wafers are rinsed with DI-water for 10 min and spin dried. All rinse treatments are performed at room temperature.

In order to evaluate the effect of the different acid solutions on the corrosion rate of aluminium in the absence of the organic stripper, a few wafers are dry stripped using the barrel reactor type etching tool PRS800 (Plasma Technology) for 45 min. and immersed in the same way as the wet stripped wafers in the different acidic solution mixtures. As a reference, the processed wafers are compared with a wafer which was stripped using an organic stripper, followed by an isopropyl alcohol (IPA) dip for 2 min. and DI-rinse. For statistics, two wafers are taken at each condition.

Scanning electron microscopy (Hitachi 4500) is assessed for residue inspection and linewidth loss evaluation of the aluminium lines after treatment in the different mixtures. The corrosion of the aluminium is also evaluated electrically by measuring the resistance R of the metal lines since the resistance is correlated to the cross-section of the metal lines according to:

$$R = \frac{LD}{ot}$$

where L is the length (4.63 m or 4.51 m), D the resistivity ($3 \times 10^{-8}$ S m), o the width (0.8 $\mu$m) and t the thickness (0.7 $\mu$m) of the meander lines. Measurements were performed respectively at 11 and 84 different chips for the bare and stacked Al-wafers. At each chip, 4 meander structures (two with length 4.63 m and two with length 4.51 m) are measured. From the measured resistances, the yield can be calculated according to $$\text{Yield } (\%) = \frac{\text{number of non-corroded meanders}}{\text{total number of meanders}} \times 100$$

All meander types are included in the data analysis.

Results

Figure 3B:
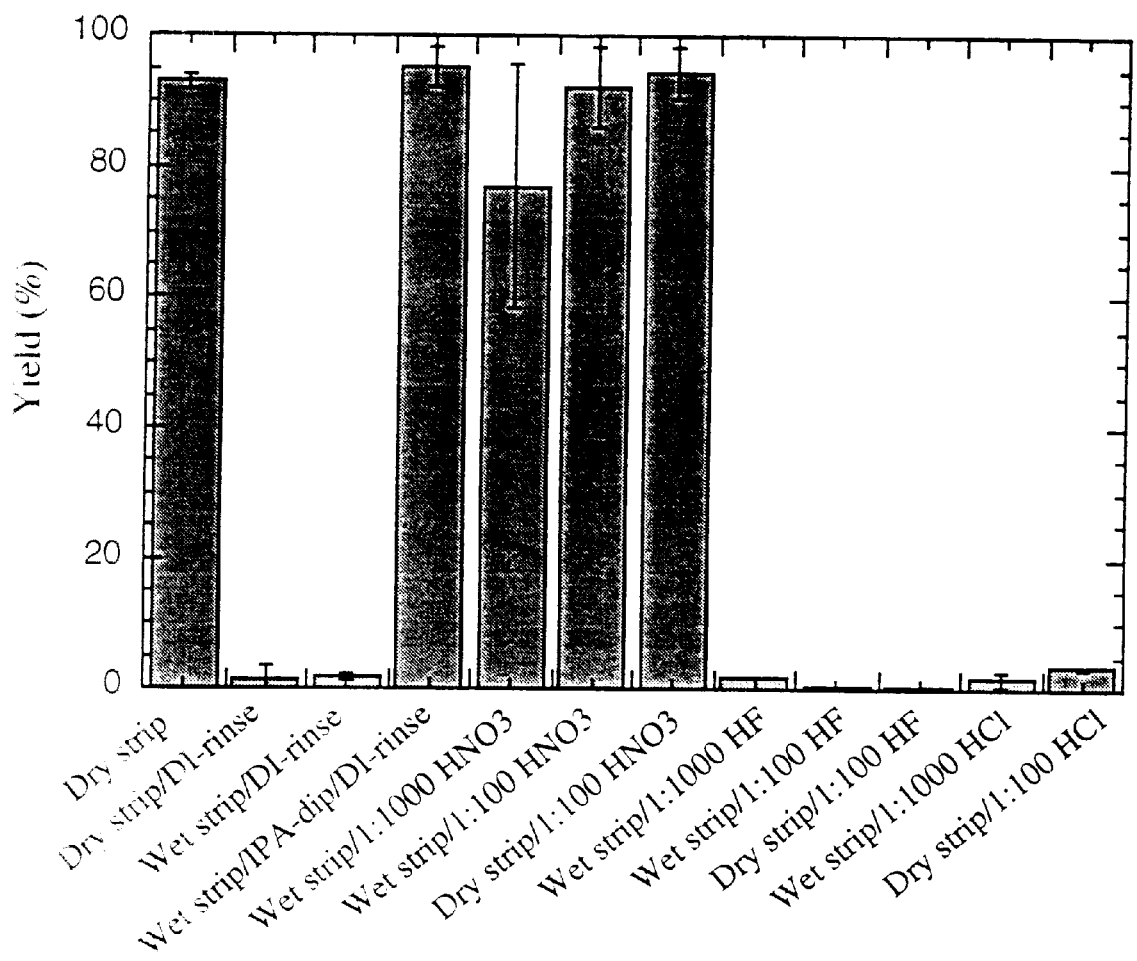
FIG. 3b gives the electrical yield calculated for stacked Al-meander structures.

The degree of corrosion of metal lines, as determined by visual inspection with SEM, after the different post-stripping treatments is summarized in table I (FIG. 1). The average resistance measured for the meander structure with 4.63 m length is shown in table II (FIG. 2), both for the bare and stacked wafers. Electrical yield is calculated with the following selection criterion: a bare Al-meander is considered to be "good" when its resistance lies in the intervals 270–300 kS and 260–290 kS respectively for the length 4.63 m and 4.51 m. As a selection criterion for the stacked meanders, the intervals are taken to be: 260–290 kS and 250–280 kS respectively for the long and the short structures. Thus, all shorts as well as open meanders are excluded. The results are given in FIGS. 3a and 3b, respectively for the bare and stacked meander structures.

Figure 4:
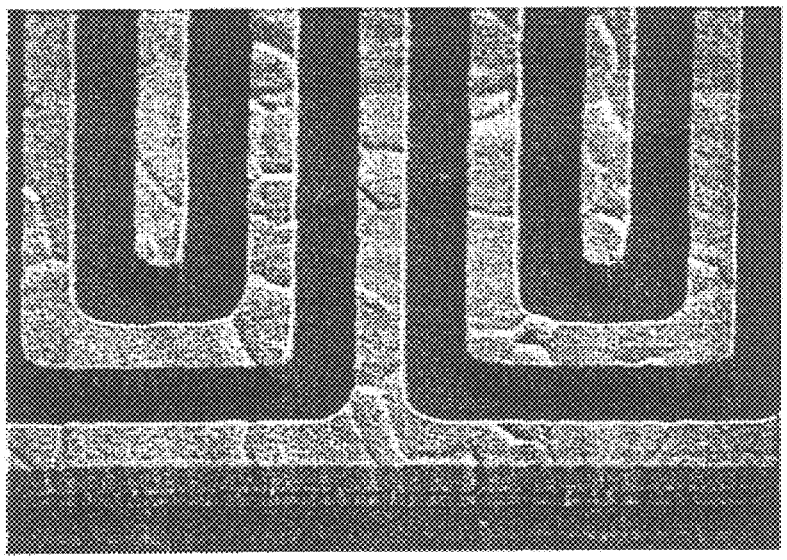
FIG. 4 is a picture of bare aluminium lines which received an IPA-dip in order to remove the organic stripper before DI-rinsing.

FIG. 4 shows the aluminium layer after being stripped with MS-2001 and followed by a IPA dip before a DI rinse according to the prior art.

Figure 5:
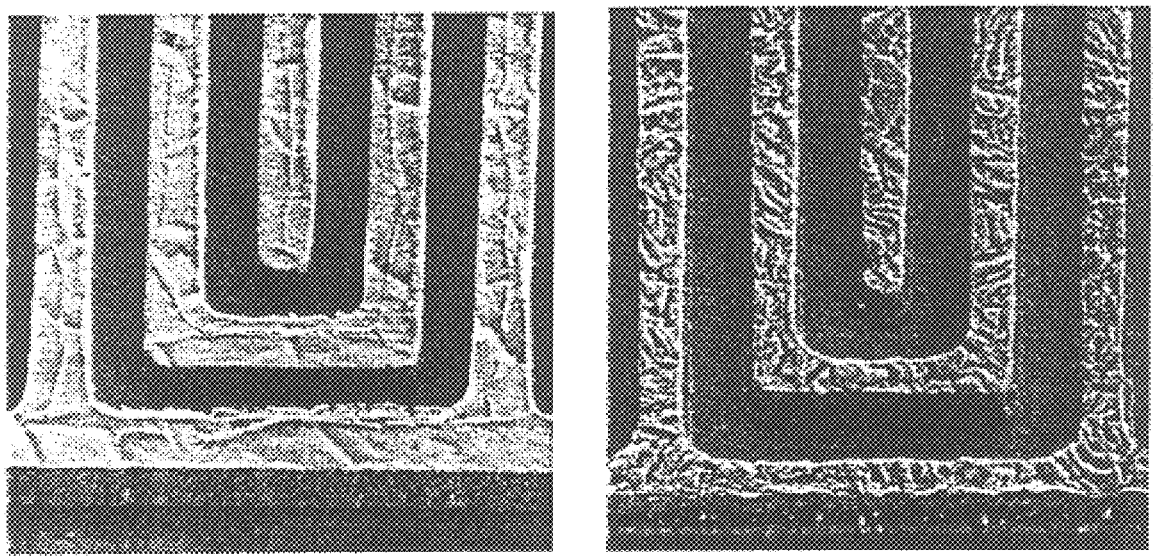
FIG. 5 (left) is a picture of bare Al-lines after dry-stripping.

After dry stripping, residues of resist are still present on the wafer surface (see FIG. 5). However, the meander resistance can be accurately determined and the yield has not diminished markedly compared to the reference wafers. Reference wafers are wet stripped, followed by a IPA dip and DI rinse. When the dry-stripped wafers are put in pure DI-water, the metal lines start corroding and an increase in the resistance is observed. When the wafers are stripped with the organic stripper, without the IPA dip after stripping, the corrosion observed after the DI-rinse is even more pronounced as follows from the electrical measurements and SEM-pictures (see FIG. 5).

Figure 6:
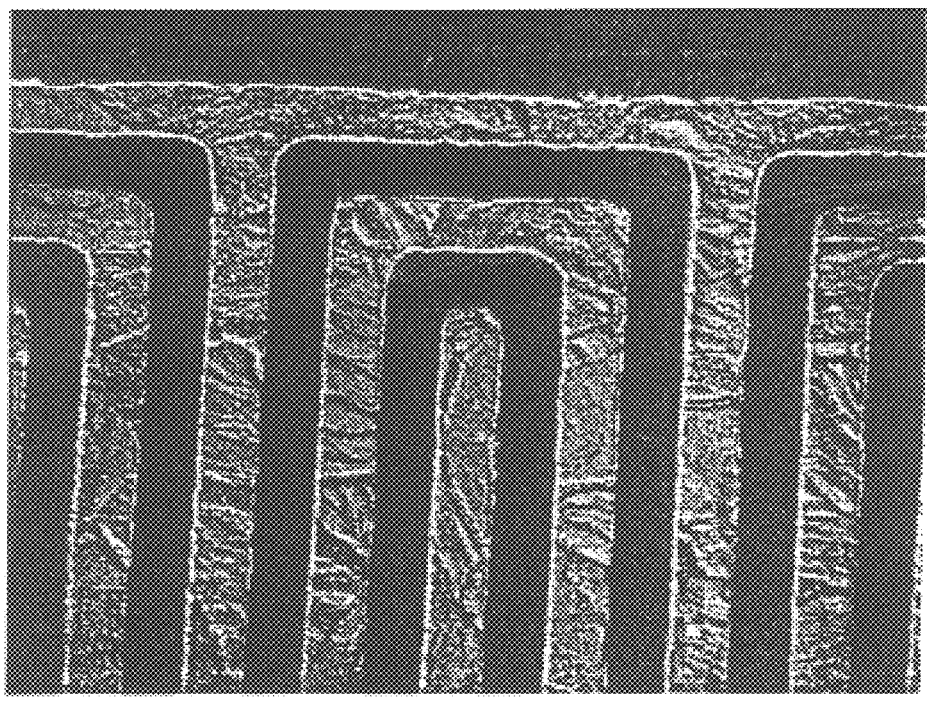
FIG. 6 is a picture of Al-lines treated with diluted $HNO_3$ (1:100 diluted) after wet-stripping.

When the DI rinse is replaced by a 1:100 diluted $HNO_3$ solution, better results are obtained. After comparison with the SEM-picture of non-corroded aluminium lines stripped via the reference procedure (see FIG. 4), only a minor surface degradation of the aluminium can be observed (see FIG. 6). This surface degradation has a rather small effect on the electrical characteristics of the meander lines: the resistance is comparable to the resistance of the reference wafers whereas FIG. 3 shows that the yield approximates the yield of the wafers processed using the reference conditions.

The observed surface degradation can probably be attributed to the extreme testing conditions and is significantly reduced when standard rinsing conditions are used, mainly because under normal circumstances, the contact time with the rinsing solution is significantly shorter. As such a 5 min. stay in the stagnant tank according to example 1 results in a non-degraded wafer surface.

Two other acids are being evaluated and compared to $HNO_3$.

Figure 7:
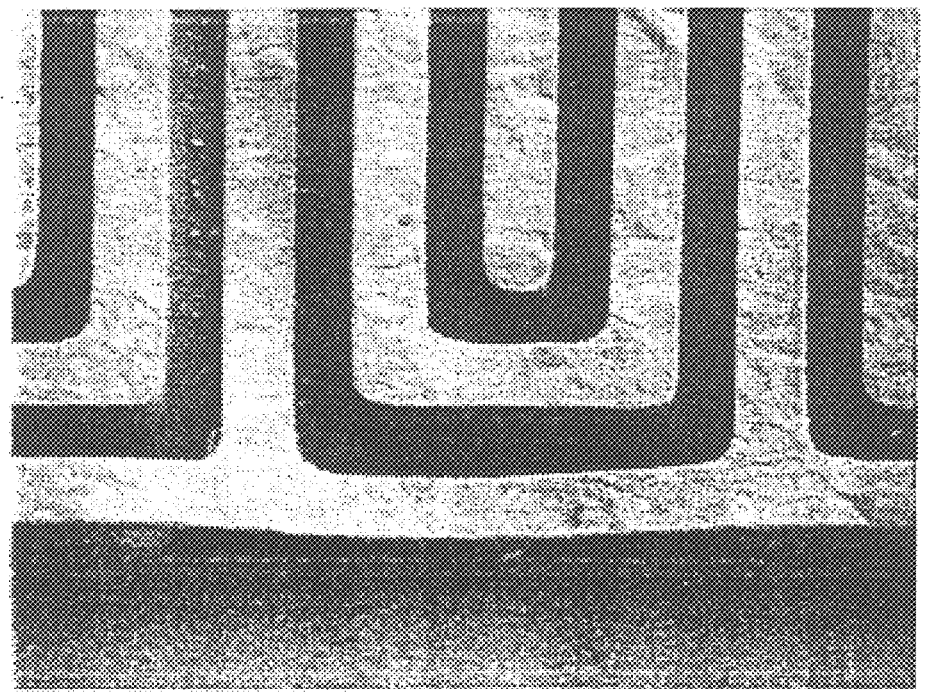
FIG. 7 is a picture of stacked Al-meander structures treated with 1:100 HCl after wet-stripping.

Rinsing-off the organic stripper in diluted HC1 results in a very localized line degradation (see FIG. 7) which causes severe changes in the measured resistance and consequently a decrease of the yield. The same phenomenon is observed for the dry stripped wafers dipped in diluted HC1.

Figure 8:
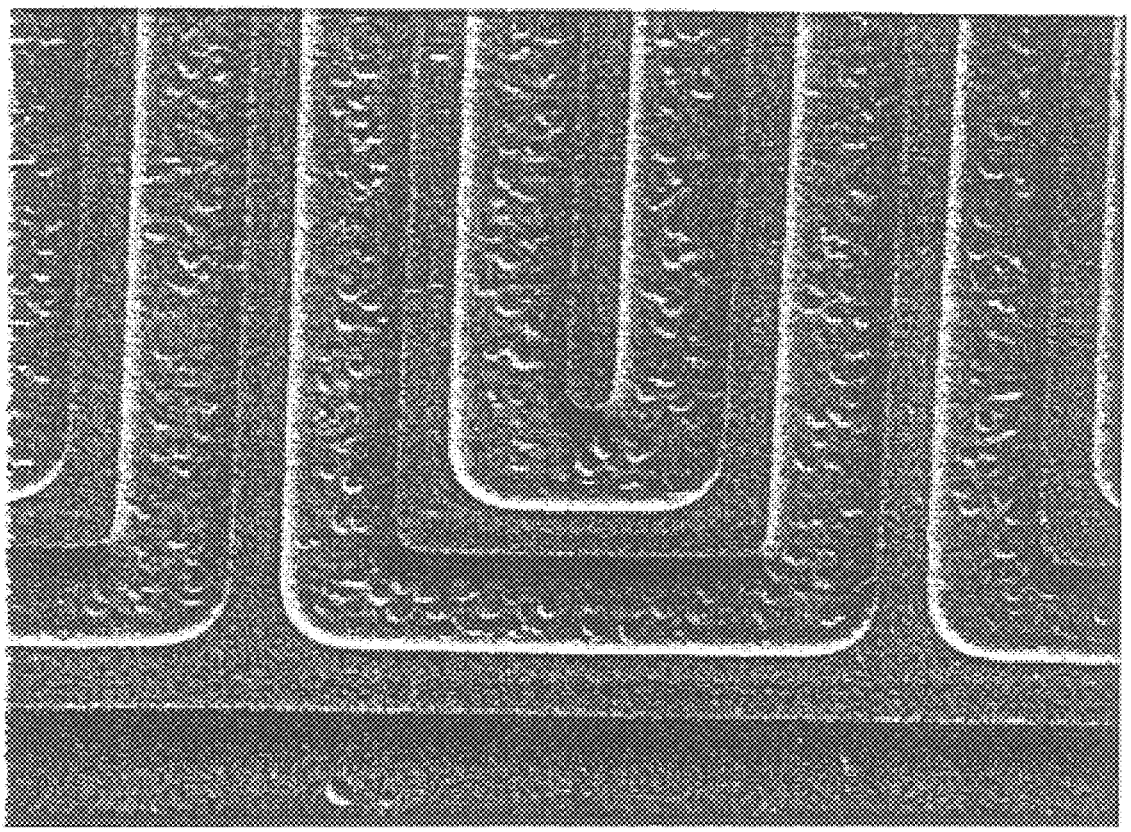
FIG. 8 is a picture of bare Al-meanders treated with 1:100 HF after wet-stripping.

Rinsing wafers with diluted HF after solvent stripping results in a very severe corrosion: metal lines are completely etched away as can be seen in FIG. 8.

In conclusion, a post-stripping rinse solution with diluted $HNO_3$ is found to be effective in preventing the corrosion of aluminium alloys caused by the rinsing of organic strippers. We can therefore conclude that diluted $HNO_3$-solutions offer interesting perspectives for replacing the commonly used IPA-dip after stripping and allows a more efficient pH control compared to carbonic acid comprising rinsing solutions.

What is claimed is:

1. A method for processing a substrate having a base layer and a metal layer the metal layer at least partially covering the base layer, and the metal layer being susceptible to microcorrosion by an alkaline species, the method comprising the steps of:
    patterning said substrate with a photoresist layer;
    applying a photoresist stripper to said photoresist layer, wherein said photoresist stripper is capable of reacting with an alkaline species precursor to produce an alkaline species;
    stripping the photoresist layer from the substrate;
    rinsing said substrate with a rinsing solution, the rinsing solution comprising an alkaline species precursor and a strong inorganic acid, the acid being present in an amount sufficient to neutralize the alkaline species produced by reaction of the photoresist stripper and the alkaline species precursor, the rinsing solution thereby reducing microcorrosion of the metal layer.

2. Method as recited in claim 1, wherein said rinsing solution further comprises water.

3. Method according to claim 2, wherein the rinsing solution is de-ionised-water based.

4. Method according to claim 3, wherein said alkaline species comprises a corroding agent other than hydroxyl ion.

5. Method as recited in claim 1, wherein the photoresist stripper comprises an alkanolamine.

6. Method according to claim 1, wherein said strong inorganic acid is selected from the group consisting of $HNO_3$, $H_2SO_4$, HI, $H_3PO_4$, $H_3CrO_4$, and mixtures thereof.

7. Method according to claim 1, wherein said strong inorganic acid is $HNO_3$.

8. Method according to claim 7, wherein the rinse solution is a 1:80 to 1:1200 diluted nitric acid solution.

9. Method according to claim 8, wherein the rinse solution is a 1:100 diluted nitric acid solution.

10. Method according to claim 1, wherein said metal layer is a metal stripe on top of said base layer.

11. Method according to claim 1, wherein said metal layer is in a pattern of metal stripes on top of said base layer.

12. Method according to claim 1, wherein the metal layer comprises aluminium or an aluminium alloy.

13. Method according to claim 1, wherein said substrate comprises a semiconductor.

14. Method according to claim 1, wherein the solution consists essentially of water and at least one strong inorganic acid.

15. Method according to claim 1, further comprising the step of drying the substrate, wherein said drying step immediately follows said rinsing step.

16. Method according to claim 1, wherein the alkaline species precursor comprises water.

17. A method for processing a substrate having a base layer and a metal layer, the metal layer at least partially covering the base layer, and the metal layer being susceptible to microcorrosion by an alkaline species, the method comprising the steps of:
    (a) processing said substrate for use in a semiconductor device, whereby a substance capable of reacting with an alkaline species precursor to produce an alkaline species is deposited on said substrate; and thereafter
    (b) rinsing said substrate with a rinsing solution, the rinsing solution comprising an alkaline species precursor and a strong inorganic acid, the acid being present in an amount sufficient to neutralize the alkaline species produced by reaction of the substance and the alkaline species precursor, the rinsing solution thereby reducing microcorrosion of the metal layer.

18. Method as recited in claim 17, wherein said rinsing solution further comprises water.

19. Method according to claim 18, wherein the rinsing solution is de-ionised-water based.

20. Method according to claim 19, wherein said alkaline species comprises a corroding agent other than hydroxyl ion.

21. Method as recited in claim 17, wherein the processing step comprises stripping photoresist from the substrate using a photoresist stripper comprising an alkanolamine.

22. Method according to claim 17, wherein said strong inorganic acid is selected from the group consisting of $HNO_3$, $H_2SO_4$, HI, $H_3PO_4$, $H_3CrO_4$, and mixtures thereof.

23. Method according to claim 17, wherein said strong inorganic acid is $HNO_3$.

24. Method according to claim 23, wherein the rinse solution is a 1:80 to 1:1200 diluted nitric acid solution.

25. Method according to claim 24, wherein the rinse solution is a 1:100 diluted nitric acid solution.

26. Method according to claim 17, wherein said metal layer is a metal stripe on top of said base layer.

27. Method according to claim 17, wherein said metal layer is in a pattern of metal stripes on top of said base layer.

28. Method according to claim 17, wherein the metal layer comprises aluminum or an aluminum alloy.

29. Method according to claim 17, wherein the solution consists essentially of water and at least one strong inorganic acid.

30. Method according to claim 17, further comprising the step of drying the substrate, wherein said drying step immediately follows said rinsing step.

31. Method according to claim 17, wherein the alkaline species precursor comprises water.

32. Method according to claim 17, wherein the processing step comprises removing a residue of a photoresist layer from the substrate using a residue stripper comprising an alkanolamine.

* * * * *